United States Patent
Zampini et al.

(10) Patent No.: US 8,142,988 B2
(45) Date of Patent: Mar. 27, 2012

(54) COATING COMPOSITIONS FOR USE WITH AN OVERCOATED PHOTORESIST

(75) Inventors: Anthony Zampini, Westborough, MA (US); Edward K. Pavelchek, Stow, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/385,012

(22) Filed: Mar. 20, 2006

(65) Prior Publication Data

US 2006/0228646 A1    Oct. 12, 2006

Related U.S. Application Data

(60) Provisional application No. 60/663,673, filed on Mar. 20, 2005.

(51) Int. Cl.
*G03F 7/30* (2006.01)

(52) U.S. Cl. ....... 430/326; 430/14; 430/270.1; 430/330; 430/511; 430/512; 430/513; 428/480

(58) Field of Classification Search .................. 428/480; 430/14, 270.1, 511, 512, 513, 326, 330
See application file for complete search history.

(56) References Cited

U.S. PATENT DOCUMENTS

| 5,776,652 | A  | * | 7/1998 | Eichhorn et al. ............... 430/163 |
| 5,919,599 | A  | * | 7/1999 | Meador et al. ............. 430/271.1 |
| 6,503,689 | B2 |   | 1/2003 | Zampini et al. ............. 430/270.1 |
| 6,528,235 | B2 |   | 3/2003 | Thackeray et al. ......... 430/271.1 |
| 6,599,951 | B2 |   | 7/2003 | Zampini et al. .................. 521/50 |
| 6,689,535 | B2 | * | 2/2004 | Iguchi et al. ................ 430/270.1 |
| 6,855,466 | B2 | * | 2/2005 | Pavelchek et al. .............. 430/14 |
| 7,361,444 | B1 | * | 4/2008 | Angelopoulos et al. ....... 430/166 |
| 2003/0180559 | A1 | * | 9/2003 | Wayton et al. ................. 428/480 |
| 2006/0110682 | A1 |   | 5/2006 | Thackeray et al. ........ 430/270.1 |

* cited by examiner

*Primary Examiner* — John Chu
(74) *Attorney, Agent, or Firm* — Peter F. Corless; Darryl P. Frickey; Edwards Wildman Palmer LLP

(57) ABSTRACT

Organic coating composition are provided including antireflective coating compositions that can reduce reflection of exposing radiation from a substrate back into an overcoated photoresist layer and/or function as a planarizing or via-fill layer. Preferred compositions of the invention comprise contain a crosslinker component that is resistant to sublimination or other migration crosslinker from the composition coating layer during lithographic processing.

10 Claims, 2 Drawing Sheets

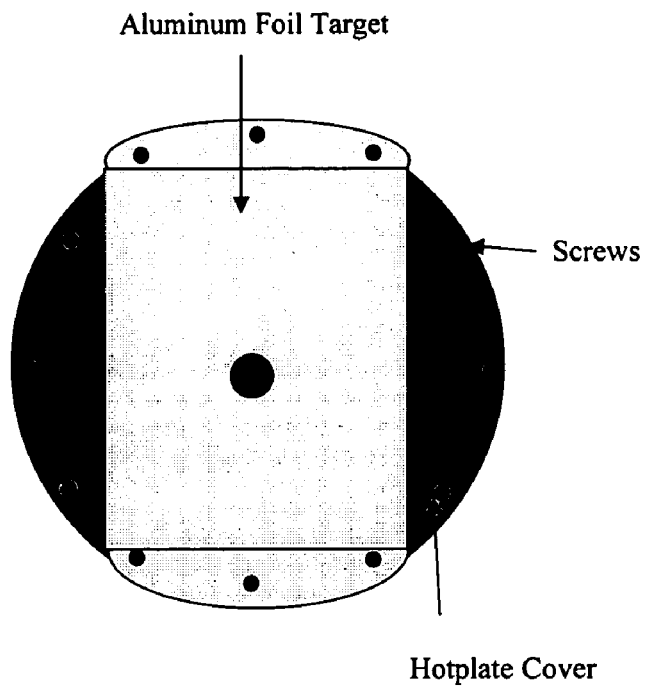
Figure 1
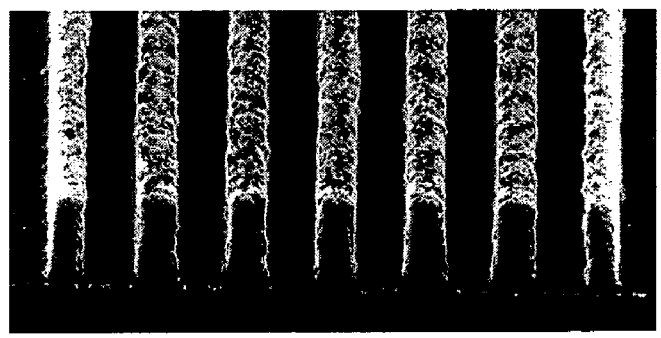
Figure 2. SEM image (90 nm; 1:1) of developed 193 nm photoresist over anti-reflective composition of Example 36.

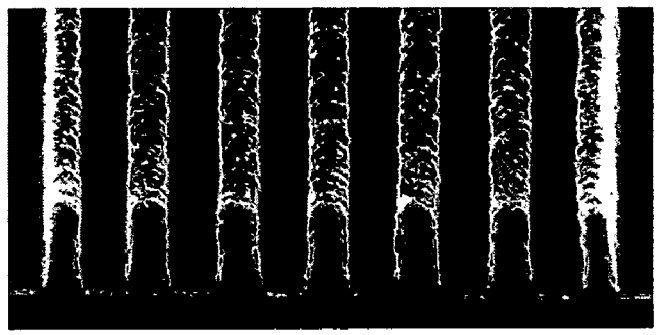
Figure 3. SEM image (110 nm; 1:1) of developed 193 nm photoresist over anti-reflective composition of Example 37

COATING COMPOSITIONS FOR USE WITH AN OVERCOATED PHOTORESIST

BACKGROUND OF THE INVENTION

1. Field of the Invention

The present invention relates to compositions (particularly antireflective coating compositions or "ARCs") that can reduce reflection of exposing radiation from a substrate back into an overcoated photoresist layer and/or function as a planarizing or via-fill layer. More particularly, the invention relates to organic coating compositions, particularly antireflective coating compositions, that contain a crosslinker component that is resistant to sublimation or other migration from the composition coating layer during lithographic processing. Preferred antireflective compositions of the invention may contain a crosslinker component that has increased molecular weight.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced or chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less soluble in the developer solution. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See for example, PCT Application WO 90/03598, EPO Application No. 0 639 941 A1 and U.S. Pat. Nos. 4,910,122, 4,370,405, 4,362,809, and 5,939,236. Such layers have also been referred to as antireflective layers or antireflective compositions. See also U.S. Pat. Nos. 5,939,236; 5,886,102; 5,851,738; 5,851,730; 5,939,236; 6,165,697; 6,316,165; 6,451,503; 6,472,128; 6,502,689; 6,503,689; 6,528,235; 6,653,049; and U.S. Published Patent Applications 20030180559 and 2003008237, all assigned to the Shipley Company, which disclose highly useful antireflective compositions.

For many high performance lithographic applications, particular antireflective compositions are utilized in order to provide the desired performance properties, such as optimal absorption properties and coating characteristics. See, for instance, the above-mentioned patent documents. Nevertheless, electronic device manufacturers continually seek increased resolution of a photoresist image patterned over antireflective coating layers and in turn demand ever-increasing performance from an antireflective composition.

It thus would be desirable to have new antireflective compositions for use with an overcoated photoresist. It would be particularly desirable to have new antireflective compositions that exhibit enhanced performance and could provide increased resolution of an image patterned into an overcoated photoresist.

SUMMARY OF THE INVENTION

We have now discovered new antireflective compositions ("ARCs") for use with an overcoated photoresist layer. Preferred organic coating compositions and systems of the invention can provide enhanced lithographic results (e.g., resolution) of an overcoated photoresist image.

More specifically, organic coating compositions, particularly antireflective compositions for use with an overcoated photoresist, are provided that comprise a crosslinker component that is resistant to sublimation from a coating layer as may occur during thermal treatment of a coating layer of the composition. For example, a crosslinker component employed in compositions of the invention may comprise a reaction product of one or more reagents that provide one or more relatively high molecular weight crosslinker compounds.

In certain preferred embodiments, the crosslinker component may comprise a reaction product of reagents comprising one or more nitrogen-containing crosslinker compounds such as one or more amine crosslinkers and one or more hydroxy-containing compound. As referred to herein, a "hydroxy-containing compound" suitably can form a reaction product with a nitrogen-containing crosslinker compound(s) or other crosslinker compound is inclusive of a variety of compounds that may have one or more hydroxy groups including alcohol groups, phenolic or other aromatic hydroxy groups as well as carbonyl (i.e. acids —COOH) groups. In particularly preferred systems, the crosslinker component may comprise a reaction product of the following 1) and 2): 1) one or more of glycoluril, melamine, urea, or guanamine compound, or mixtures thereof and 2) one or more compounds that comprises an alcohol, carboxy and/or phenolic moieties, or mixtures thereof.

Antireflective coating compositions of the invention preferably also will comprise a component that contains one or more chromophore groups that can effectively absorb exposure radiation employed to image an overcoated photoresist layer. Typical chromophore groups are aromatic groups such as optionally substituted carbocyclic aryl groups including optionally substituted phenyl, anthracene and naphthyl. For antireflective coating compositions that are used with an overcoated photoresist composition imaged at 248 nm, preferred chromophore groups may include optionally substituted anthracene and optionally substituted naphthyl. For antireflective coating compositions that are used with an overcoated photoresist composition imaged at 193 nm, preferred chromophore groups may include optionally substituted phenyl.

Such chromophore groups may be incorporated into an antireflective coating composition of the invention through a variety of approaches. Preferred compositions may comprise a resin component in addition to the crosslinker component where the resin component comprises one or more resins that comprise one or more chromophore groups such as optionally substituted carbocyclic aryl groups that may be pendant or integral to a resin backbone. Alternatively or in addition to such use of an absorbing resin, a crosslinker component may comprise one or more such chromophore groups, or the antireflective composition may comprise a further component such as one or more non-polymeric dye compounds that comprise such chromophore groups, e.g. a small molecule (e.g. MW less than about 1000 or 500) that contains one or more chromophore moieties, such as one or more optionally substituted phenyl, optionally substituted anthracene or optionally substituted naphthyl groups.

Preferably, coating compositions of the invention can be cured through thermal treatment of the composition coating layer. Suitably, the coating composition also contains an acid or more preferably an acid generator compound, particularly a thermal acid generator compound, to facilitate the crosslinking reaction.

For use as an antireflective coating composition, as well as other applications such as via-fill, preferably the composition is crosslinked prior to applying a photoresist composition layer over the composition layer.

Coating compositions of the invention are typically formulated and applied to a substrate as an organic solvent solution, suitably by spin-coating (i.e. a spin-on composition).

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as about 248 nm, or radiation having a wavelength of less than about 200 nm, such as 193 nm.

The invention further provides methods for forming a photoresist relief image an electronic devices as well as novel articles of manufacture comprising substrates (such as a microelectronic wafer substrate) coated with an antireflective composition of the invention alone or in combination with a photoresist composition.

Other aspects of the invention are disclosed infra.

BRIEF DESCRIPTION OF THE DRAWINGS

FIG. 1 depicts a foil "target" employed in sublimation tests detailed in the Examples 52-54 which follow.

FIG. 2 shows a scanning electron micrograph (SEM) of a developed photoresist relief image of Example 55 over an antireflective composition of Example 36 which follows.

FIG. 3 shows a SEM of a developed photoresist relief image of Example 55 over an antireflective composition of Example 37 which follows.

DETAILED DESCRIPTION OF THE INVENTION

As discussed above, organic coating compositions, particularly antireflective compositions for use with an overcoated photoresist, are provided that comprise a crosslinker component that is resistant to sublimation from a coating layer as may occur during thermal treatment of a coating layer of the coating composition. For example, a crosslinker component employed in compositions of the invention may be a reaction product of one or more reagents that can provide a relatively high molecular weight crosslinker compound.

Without being bound by any theory, it is believed that one or more components of an underlying coating composition can migrate out of an applied coating layer during lithographic processing. In particular, it is believed that during thermal processing of an applied coating composition to crosslink or otherwise harden the coating layer one or more composition components can sublime or otherwise migrate from the coating layer. Such sublimed materials can compromise lithographic performance in a variety of ways, including by depositing on a subsequently applied photoresist coating layer.

Crosslinker Component of Underlying Coating Composition

As discussed above, we have found that modifying the crosslinker component of an underlying coating composition can minimize possible sublimation of the crosslinker component.

A crosslinker component may be modified in any of a number of ways in accordance with the invention. Generally preferred modifications increase the molecular weight of the crosslinker material.

For example, a non-polymeric crosslinker material may be dimerized, trimerized, and the like to form a higher molecular weight oligomer or polymer, e.g. a crosslinker material having a molecular weight of at least about 250 daltons, more preferably at least about 300, 400, 500, 600, 700, 800, 900, 1000, 1500, 2000, 2500, 3000, 3500, 4000, 4500 or 5000 daltons.

Rather than or in addition to such self-condensation of a crosslinker component, the crosslinker may be reacted with one or more distinct materials to increase molecular weight, such as one or more alcohol compounds, including one or more diols, triols and/or other polyols as well as reagents containing carboxy-groups and phenolic groups, e.g. various glycols such as ethylene glycol, propylene glycol and the like, acids and esters which may have hydroxy groups separate from carboxy functionalities such as methyl 2-hydsroxy-isobutyrate, and the like.

Amine-based crosslinkers are particularly preferred for use in accordance with the invention, including glycoluril, guanamine (including benzoguanamine), melamine, urea compositions, and other reactive composition that comprise one or more nitrogen moieties.

In particularly preferred aspects of the invention, a glycoluril or other amine-based crosslinker may be reacted with one or more alcohols such as a diol or triol or other polyol to provide a higher molecular reaction product which can be less susceptible to undesired sublimation or other migration from an antireflective composition coating layer. In addition to reaction with an alcohol, a glycoluril or other amine-based crosslinker can be reacted with compounds containing other reactive groups such as phenolic and carboxyl moieties.

In a particularly preferred aspect, a glycoluril including an alkoxylated glycoluril such as tetramethoxymethyl glycoluril can be reacted in the presence of water with one or more addition reagents such as one or more alcohols, e.g. with water, alcohols, diols and/or other polyols to produce soluble, non subliming product mixtures comprising one or more of dimers, trimers, oligomers and relatively low molecular weight polymers.

In addition to such molecular weight-increasing substitution reactions that involve use of water, such reaction also may be conducted under dry (anhydrous) conditions using dried reactants.

However, substitution reactions that include water and one or more addition reagents such as one or more alcohol compounds can be preferred over an anhydrous substitution reaction. Reactions run in the presence of trace water can provide cost and safety advantages. Varying amounts of water also can participate in the condensation reaction.

As indicated above, a wide variety of crosslinker materials may be modified in accordance with the invention, including a wide variety of amine-based crosslinkers such as a variety of glycolurils including butylated glycoluril; melamine resins; a variety of ureas including alkoxyureas such as dimethoxymethyl urea, butylated hydroxyethylene urea resin and the like, and methylated propylene urea resin; and various guanamine compositions such as methylated guanamine resins.

Some specific materials that may be modified (e.g., reacted with a hydroxy or carboxy-containing compound(s)) for use as a crosslinker material of underlying organic coating compositions of the invention include melamine materials, including melamine resins such as manufactured by Cytec Industries and sold under the tradename of Cymel 300, 301, 303, 350, 370, 380, 1116 and 1130. Glycolurils are particularly preferred crosslinker materials including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Suitable substantially neutral crosslinkers that may be modified (e.g., reacted with a hydroxy or carboxy-containing compound(s)) for use as a crosslinker material of underlying organic coating composition of the invention include hydroxy compounds, particularly polyfunctional compounds such as phenyl or other aromatics having one or more hydroxy or hydroxy alkyl substitutents such as a $C_{1-8}$hydroxyalkyl substitutents. Phenol compounds are generally preferred such as di-methanolphenol $(C_6H_3(CH_2OH)_2)OH)$ and other compounds having adjacent (within 1-2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

A crosslinker component of underlying coating compositions of the invention in general suitably may be present in an amount of between about 5 and 50 weight percent of total solids (all components except solvent carrier) of the antireflective composition, more typically in an amount of about 7 to 25 weight percent total solids.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

The crosslinker component may be covalently linked to the resin component, e.g. where the resin can react with itself during thermal curing. However, in many preferred systems, the crosslinker component and resin component will be separate (i.e. not covalently linked) materials.

Resin Component of Underlying Coating Composition

Preferred antireflective coating composition of the invention suitably include one or more resin components.

Preferred resins employed in underlying coating compositions of the invention include resins that contain ester repeat units (polyester), such as provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like.

Preferably, an ester functionality is present as a component of, or within, the polymer backbone rather than as a pendant or side chain unit. Ester moieties also may be present as a pendant group, but preferably the polymer also contains an ester functionality along the polymer backbone. Also preferred is where the ester repeat unit comprises aromatic substitution, such as optionally substituted carbocyclic aryl groups e.g. optionally substituted phenyl, naphthyl or anthracenyl substitution, either as a side chain or more preferably along the polymer backbone.

It will be understood that in such polyester resins at least certain of the ester groups are not photoacid-labile, i.e. the ester repeat units do not undergo deblocking or other cleavage during typical lithographic processing of pre-exposure bake, exposure to activating radiation, post-exposure heating, and/or development. Preferably, ester repeat units are present in the polymer backbone, i.e. the ester groups (—(C=O)O—) are present on the branched or substantially linear chain that forms the polymer length. Also preferred is that such ester groups contain aromatic substitution, e.g. a phenyl, naphthyl or anthracene group, such as may be provided by reaction of a an alkyl phthalate with a polyol.

Such a polyester resin may contain other repeat units, either as pendant or side chain units, or as other repeat units along the polymer backbone. For example, the resin may be a copolymer (e.g. two distinct repeat units along resin backbone), terpolymer (e.g. three distinct repeat units along resin backbone), tetraplymer (e.g. four distinct repeat units along polymer backbone) or pentapolymer (e.g. five distinct repeat units along polymer backbone). For instance, suitable will be polymers that contain ether and ester repeat units, or alkylene repeat units together with ester and ether units. Additional repeat units that contain one or more oxygen atoms are preferred for many applications.

Exemplary preferred resins that may be utilized in coating compositions of the invention include those that are formed by reaction of a compound that contains one or more carboxyl (e.g. ester, anhydride, carbocyclic acid) groups together with a compound that contains one or more hydroxy group preferably at least two hydroxy groups. The carboxyl-containing compound also preferably may contain two or more carboxyl (—C=OO—) groups. The carboxyl and hydroxy compound are suitably reacted in the presence of acid, optionally with other compounds if copolymer or other higher order polymer is desired, to thereby provide a polyester resin.

Such polyester resins are suitably prepared by charging a reaction vessel with the a polyol, a carboxylate compound, and other compounds to be incorporated into the formed resin, an acid such as a sulfonic acid, e.g. methane sulfonic acid or para-toluene sulfonic acid, and the like. The reaction mixture is suitably stirred at an elevated temperature, e.g. at least about 80° C., more typically at least about 100° C., 110° C., 120° C., 130° C., 140° C., or 150° C. for a time sufficient for polymer formation, e.g. at least about 2, 3, 4, 5, 6, 8, 12, 16, 20, 24 hours. Exemplary preferred conditions for synthesis of useful resins are detailed in the examples which follow.

Acrylate-based resins also are preferred materials to use in underlying coating compositions of the invention. Such resins can be prepared by known methods, such as polymerization (e.g. in the presence of a radical initiator) of one or more acrylate monomers such as e.g. hydroxyethylmethylacrylate, hydroxyethylacrylate, methylmethacrylate, butyl methacrylatemethylanthracene methacrylate or other anthracene acrylate and the like. See U.S. Pat. No. 5,886,102 assigned to the Shipley Company for exemplary suitable polymers. See also the examples which follow for suitable acrylate resins and syntheses thereof.

For antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophore, e.g. groups having from two to three to four fused or separate rings with 3 to 8 members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4-5 of European Published Application 813114A2 of the Shipley Company.

As discussed above, for imaging at 193 nm, the antireflective composition preferably may contain a resin that has phenyl chromophore units. For instance, one suitable antireflective resin for use with photoresists imaged at 193 nm is a terpolymer consisting of polymerized units of styrene, 2-hydroxyethylmethacrylate and methylmethacrylate (30:38:32 mole ratio). Such phenyl group containing resins and use of same in antireflective compositions have been disclosed in U.S. application Ser. No. 09/153,575, file 1998 and corresponding European Published Application EP87600A1, assigned to the Shipley Company.

Such coating compositions comprising a resin or other component are employed as described above. Thus, for example, the composition may suitably comprise a crosslinker and an acid source such as an acid or acid generator compound particularly a thermal acid generator compound whereby the applied coating composition can be crosslinked such as by thermal treatment prior to application of an overcoated photoresist layer.

Preferably resins of antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

While coating composition resins having absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the coating compositions of the invention may vary within relatively broad ranges, and in general the resin binder is employed in a concentration of from about 50 to 95 weight percent of the total of the dry components of the coating composition, more typically from about 60 to 90 weight percent of the total dry components (all components except solvent carrier).

Acid or Acid Generator Compound

As mentioned, preferred underlying coating compositions of the invention can be crosslinked, e.g. by thermal and/or radiation treatment. For example, preferred underlying coating compositions of the invention may contain a separate crosslinker component that can crosslink with one or more other components of the antireflective composition. Generally preferred crosslinking underlying compositions comprise a separate crosslinker component. Particularly preferred antireflective compositions of the invention contain as separate components: a resin, a crosslinker, and a thermal acid generator compound. Additionally, crosslinking antireflective compositions of the invention preferably can also contain an amine basic additive to promote elimination of footing or notching of the overcoated photoresist layer. Crosslinking underlying compositions are preferably crosslinked prior to application of a photoresist layer over the antireflective coating layer. Thermal-induced crosslinking of the underlying composition by activation of the thermal acid generator is generally preferred.

Crosslinking underlying compositions of the invention preferably comprise an ionic or substantially neutral thermal acid generator, e.g. an ammonium arenesulfonate salt, for catalyzing or promoting crosslinking during curing of an antireflective composition coating layer. Typically one or more thermal acid generators are present in an antireflective composition in a concentration from about 0.1 to 10 percent by weight of the total of the dry components of the composition (all components except solvent carrier), more preferably about 2 percent by weight of the total dry components.

Coating compositions of the invention also may contain one or more photoacid generator compounds typically in addition to another acid source such as an acid or thermal acid generator compound. In such use of a photoacid generator compound (PAG), the photoacid generator is not used as an acid source for promoting a crosslinking reaction, and thus preferably the photoacid generator is not substantially activated during crosslinking of the coating composition (in the case of a crosslinking coating composition). Such use of photoacid generators is disclosed in U.S. Pat. No. 6,261,743 assigned to the Shipley Company. In particular, with respect to coating compositions that are thermally crosslinked, the coating composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

Generally preferred photoacid generators for such use in antireflective compositions or other coating of the invention include e.g. onium salts such as di(4-tert-butylphenyl)iodonium perfluoroctane sulphonate, halogenated non-ionic photoacid generators such as 1,1-bis[p-chlorophenyl]-2,2,2-trichloroethane, and other photoacid generators disclosed for use in photoresist compositions. For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkenyl having one or preferably two or more fluoro substituents.

Formulation of an Underlying Coating Composition

To make a liquid coating composition of the invention, the components of the underlying coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. A preferred solvent for an antireflective coating composition of the invention is methyl-2-hydroxyisobutyrate, optionally blended with anisole. The concentration of the dry components in the solvent will depend on several factors such as the method of application. In general, the solids content of an antireflective composition varies from about 0.5 to 20 weight percent of the total weight of the coating composition, preferably the solids content varies from about 2 to 10 weight of the coating composition.

Exemplary Photoresist Systems

A variety of photoresist compositions can be employed with coating compositions of the invention, including positive-acting and negative-acting photoacid-generating compositions. Photoresists used with underlying compositions of the invention typically comprise a resin binder and a photoactive component, typically a photoacid generator compound. Preferably the photoresist resin binder has functional groups that impart alkaline aqueous developability to the imaged resist composition.

Particularly preferred photoresists for use with underlying compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, al of which are incorporated herein by reference for their teaching of making and using chemically amplified positive-acting resists. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

The underlying compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

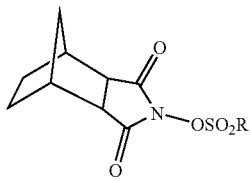

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

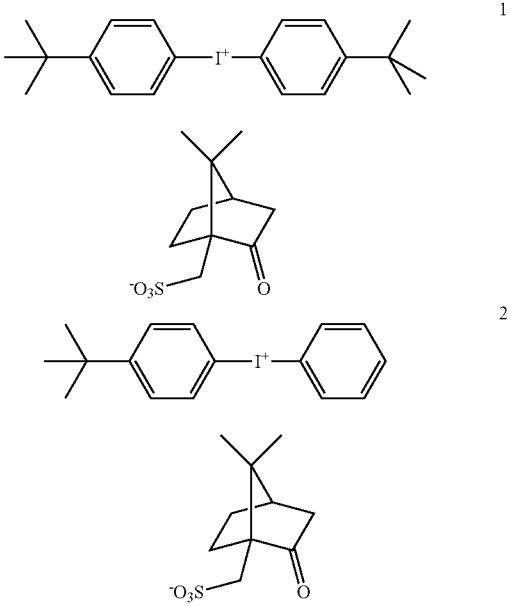

Such sulfonate compounds can be prepared as disclosed in European Patent Application 96118111.2 (publication number 07831396), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with underlying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Suitable photoacid generator compounds of resists used with underlying compositions of the invention include the onium salts, such as those disclosed in U.S. Pat. Nos. 4,442,197, 4,603,10, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonlyoxy ketones. See J. of Photopolymer Science and Technology, 4(3):337-340 (1991), for disclosure of suitable sulfonate PAGS, including benzoin tosylate, t-butylphenyl alpha-(p-toluenesulfonyloxy)-acetate and t-butyl alpha(p-toluenesulfonyloxy)-acetate. Preferred sulfonate PAGs are also disclosed in U.S. Pat. No. 5,344,742 to Sinta et al. The above camphorsulfoanate PAGs 1 and 2 are also preferred photoacid generators for resist compositions used with the underlying compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Various substituents and materials (including resins, small molecule compounds, acid generators, etc.) as being "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the antireflective composition. Cure conditions will vary with the components of the antireflective composition. Particularly the cure temperature will depend on the specific acid or acid (thermal) generator that is employed in the coating composition. Typical cure conditions are from about 80° C. to 225° C. for about 0.5 to 40 minutes. Cure conditions preferably render the coating composition coating layer substantially insoluble to the photoresist solvent as well as an alkaline aqueous developer solution.

After such curing, a photoresist is applied above the surface of the top coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 $mJ/cm^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch.

The following non-limiting examples are illustrative of the invention. All documents mentioned herein are incorporated herein by reference.

Examples 1-26

Resin Syntheses

Example 1

A terpolymer consisting of styrene, 2-hydroxyethylmethacrylate and methacrylate monomers with a mole ratio of 30:38:32 was synthesized according to the following procedure:

The monomers (styrene, 99% pure from Aldrich, 169.79 g; 2-hydroxyethylmethacrylate obtained from Rohm and Haas Corporation "Rocryl 400", 269.10; and methyl methacrylate obtained from Rohm & Haas Corporation, 173.97 g), were dissolved in 2375 g of THF in a 5 L 3-necke round bottom fitted with overhead stirring, a condenser, and a nitrogen inlet. The reaction solution was degassed with a stream of nitrogen for 20 min. The Vazo 52 initiator (11.63 g, from DuPont corporation) was added and the solution heated to reflux. This temperature was maintained for 15 hours. The reaction solution was cooled to ambient temperature and precipitated into 12 L of methyl tertiary butyl ether (MTBE)/cyclohexane (v/v 1/1). The polymer was collected by filtration under reduced pressure and dried under vacuum at about 50° C. for 48 hours. The polymer yield was 68% of which about 2.4 wt % was residual monomers. This product was found to have a glass transition temperature, Tg, of about 92° C. and a molecular weight by gel permeation chromatography relative to polystyrene standards of about Mw=22416, Mn=10031.

Example 2

A tetrapolymer of styrene:2-hydroxyethylmethacrylate: methylmethacrylate:n-butyl methacrylate in a mole % ratio of 30:38:31:1 was synthesized according to the procedure of Example 1; with the mole % of the initiator (Vazo 52) at 0.72%. Molecular weight analysis by gel permeation chromatography relative to polystyrene standards gave a weight average molecular weight of about 22646 and a number average molecular weight of about 10307 Daltons.

Example 3

A tetrapolymer of styrene:2-hydroxyethylmethacrylate: methylmethacrylate:n-butyl methacrylate in a mole % ratio of 55:30:14:1 was synthesized according to the procedure of Example 1; with the mole % of the initiator (Vazo 52) at 0.27%. Molecular weight analysis by gel permeation chromatography relative to polystyrene standards gave a weight average molecular weight of about 124761 and a number average molecular weight of about 36638 Daltons.

Example 4

A terpolymer of styrene:2-hydroxyethylmethacrylate:methylmethacrylate in a mole % ratio of 10:70:20 was synthesized according to the following procedure: To a 1 L reactor equipped with nitrogen inlet, water cooled condenser, thermocouple, electric motor with Teflon 2 blades agitator and jacket for heating/cooling were charged 32.4 g of propylene glycol methyl ether (PGME) followed by 42 g of monomer mixture pre-made at described molar ratio. The reaction mixture was stirred at 20° C. and 14.6 g of initiator solution (1.68 g of 2,2-azobis-methylbutyronitrile (ABMBN) in 249 g PGME) added. After the initiator was added, the reaction mixture was heated to 100° C. and 98 g of the monomers mixture added over one hour. At the same time the remainder of the initiator solution (131.28 g) was slowly added over four hours. The temperature was maintained at 100° C. throughout the additions. At the end of the initiator addition the reaction temperature was held at 100° C. for one more hour. The reaction mixture was further diluted with 290 g of PGME and cooled to 25° C. For the purpose of the invention the polymer solution may be used at this or lower concentration as it may be necessary. Isolation of the tetrapolymer was achieved by the slow addition of 120 g of polymer solution into 1.2 L of de-mineralized water. The precipitate was collected on a Buchner funnel and washed with two 150 g portions of de-mineralized water. The product was first air dried followed by vacuum drying at 50° C. Molecular weight analysis of the dried sample by gel permeation chromatography relative to polystyrene standards gave a weight average molecular weight of about 31286 and a number average molecular weight of 5912 Daltons.

Example 5 to 12

Representative copolymers of 2-hydroxyethylmethacrylate (HEMA) and methylmethacrylate (MMA) were prepared according to the procedure of Example 4. The copolymer compositions based on the monomer mole % feed ratio, initiator mole % and the resulting polymer molecular weights are presented in Table 1.

TABLE 1

| Example | Composition HEMA:MMA mole:mole | Initiator mole % | Mw | Mn | PD |
|---|---|---|---|---|---|
| 5 | 40:60 | 3.10% | 29715 | 11354 | 2.62 |
| 6 | 40:60 | 10.00% | 12954 | 4929 | 2.63 |
| 7 | 50:50 | 3.10% | 28777 | 9339 | 3.08 |
| 8 | 60:40 | 10 | 11,528 | 4,123 | 2.8 |
| 9 | 60:40 | 3.10% | 30050 | 14558 | 2.06 |
| 10 | 60:40 | 2.0 | 81,553 | 18,561 | 4.39 |
| 11 | 30:70 | 3.10% | 25936 | 6041 | 4.29 |
| 12 | 80:20 | 3.00% | 23780 | 5529 | 4.3 |

Examples 13 to 15

Copolymers of methyl 2-hydroxymethyl acrylate (HMAAME) with methylmethacrylate (MMA) and ethyl 2-hydroxymethyl acrylate (HMAAEE) with MMA were prepared according to the procedure of Example 4. All copolymers were made with a 50:50 monomer feed. The initiator concentration and the resulting polymer molecular weight are summarized in Table 2.

TABLE 2

| Example | Composition RHMA:MMA mole:mole R = M(methyl) or E(ethyl) | Initiator mole % | Mw | Mn | PD |
|---|---|---|---|---|---|
| 13 | 50M:50 | 3.1% | 18703 | 9507 | 1.97 |
| 14 | 50E:50 | 3.1% | 19791 | 5652 | 3.50 |
| 15 | 50E:50 | 1.2% | 37046 | 6620 | 5.60 |

Example 16

A terpolymer of 9-anthracenemethyl methacrylate (ANTMA):2-hydroxyethylmethacrylate(HEMA):methyl methacrylate(MMA) in a mole % ratio of 43:25:32 was synthesized according to the following procedure:

A 12 L 3-neck round bottom flask equipped with an overhead stirrer, condensed and nitrogen inlet was charged with 537.5 g of 9-anthracenemethyl methacrylate, 312.5 g of 2-hydroxyethyl methacrylate, 400.0 g of methyl methacrylate, and 8.00 L of tetrahydrofuran(THF). The ANTMA was first dissolved in 4 L of THF in the reaction vessel and then the HEMA and MMA were added along with another 4 L of THF. The solution was degassed for 20 minutes with nitrogen through the dispersion tube. The reaction mixture was heated during degassing in order to maintain the temperature at approximately 25° C. After degassing, 5.0 g of AIBN were added. The reaction mixture was heated at reflux for 24 hours. The reaction mixture was cooled to room temperature, precipitated into methyl t-butylether(MBTE), collected and dried under vacuum at 70° C. for 96 hours. About 1 Kg (80% yield) of a pale yellow polymer was obtained with a Mw of 64,640, a Mn of 26,258 and a Tg of 138° C.

General Synthesis Procedure for Polyester Examples 17 to 26

The following polyester examples demonstrate unique features in regards to monomer combinations, selection of chromophore, amount of chromophore, charge of solvent, charge of acid catalyst, and polymer isolation. All reagents were initially charged into the reactor with little regard to the order of addition. The reaction setup consists of a 100 or 250-mL three-neck, round-bottom flask fitted with a mechanical stirrer, temperature control box, temperature probe, heating mantle, condenser, Dean-Stark trap, and nitrogen purge inlet (sweep). Each reaction was heated first to substantial reflux (120-150 C), and then gradually to a peak temperature of about 150° C. within 30 minutes. The total reaction time (Table 3) for each reaction was marked from the point of substantial reflux, to the commencement of thermal quench. The cooled solutions were diluted prior to precipitation. The polymers were collected by filtration through a Buchner funnel, air-dried, and then dried in vacuo between 40-70 C. Polymer yields and GPC results are noted in Table 3.

Example 17

Charge: Dimethylterephthalate (DMT) (46.15 g, 237.6 mmol), 1,3,5-tris(2-hydroxyethyl)isocyanurate (THEIC) (62.08 g, 237.6 mmol), 4-hydroxyphenylacetic acid (4-HPAA) (8.48 g, 55.7 mmol), p-toluenesulfonic acid monohydrate (PTSA) (2.1 g, 11 mmol), and anisole (80 g). The polymer solution was diluted with isopropyl alcohol (IPA) and tetrahydrofuran (THF), and precipitated into isopropyl alcohol (IPA) to obtain 81% of yield.

Example 18

Charge: Dimethylterephthalate (DMT) (36.19 g, 186.4 mmol), 1,3,5-tris(2-hydroxyethyl)isocyanurate (THEIC) (48.69 g, 186.4 mmol),), 4-hydroxyphenylacetic acid (4-HPAA) (30.54 g, 200.7 mmol), p-toluenesulfonic acid monohydrate (PTSA) (2.1 g, 11 mmol), and anisole (80 g). The polymer solution was diluted with IPA and THF, and precipitated into IPA.

Example 19

Charge: DMT (22.3 g, 115 mmol), dimethyl 5-hydroxyisophthalate (18.1 g, 86 mmol), THEIC (52.5 g, 201 mmol), 2-hydroxyisobutyric acid (17.9 g, 172 mmol), PTSA (2.1 g, 11 mmol), and anisole (80 g). The polymer solution was diluted with THF (355 g) and precipitated into IPA.

Example 20

Charge: DMT (22.3 g, 115 mmol), dimethyl 5-hydroxyisophthalate (18.1 g, 86 mmol), THEIC (52.5 g, 201 mmol), 2-hydroxyisobutyric acid (18.0 g, 172 mmol), PTSA (2.1 g, 11 mmol), and anisole (82 g). The polymer solution was diluted with THF (355 g) and precipitated into IPA.

Example 21

Charge: DMT (39.0 g, 201 mmol), THEIC (52.5 g, 201 mmol), 2-hydroxyisobutyric acid (18.0 g, 172 mmol), PTSA (2.7 g, 14 mmol), and anisole (83 g). The polymer solution was diluted with THF (358 g) and precipitated into IPA.

Example 22

Charge: Dimethyl terephthalate (48.5 g, 250 mmol), ethylene glycol (12.4 g, 200 mmol), glycerol (9.0 g, 100 mmol), and PTSA (0.54 g, 2.8 mmol). Enough propylene glycol methyl ether acetate (PMA) was added to prepare an 8% solution.

Example 23

Charge: Dimethyl 2,6-naphthalenedicarboxylate (24.33 g, 99.63 mmol), dimethylterephthalate (19.44 g, 100.1 mmol), ethylene glycol (7.63 g, 123 mmol), glycerol (7.29 g, 79.2 mmol), and PTSA (0.46 g, 2.4 mmol). The resultant polymer was dissolved in a solvent mixture of HBM, anisole, and methyl 2-methoxyisobutyrate (MBM) to prepare a 10% solution.

Example 24

Charge: Dimethyl terephthalate (31.15 g, 160.4 mmol), 1,3,5-tris(2-hydroxyethyl)cyanuric acid (46.09 g, 176.4 mmol), and PTSA (1.35 g, 7.1 mmol) and anisole (52 g) The resultant polymer was diluted to 25% solution with HBM and precipitated into IPA to obtain 45.3 g (67%) of resin.

Example 25

Charge: Dimethyl terephthalate (31.11 g, 160.2 mmol), 1,3,5-tris(2-hydroxyethyl)cyanuric acid (45.80 g, 175.3 mmol), and PTSA (0.67 g, 3.5 mmol). The resultant polymer was dissolved in THF and precipitated in MTBE to obtain 50.0 g (75%).

Example 26

Charge: dimethyl phthalate (30.91 g, 159.2 mmol), 1,3,5-tris(2-hydroxyethyl)cyanuric acid (46.06 g, 176.3 mmol), and PTSA (0.67 g, 3.5 mmol). The resultant polymer was dissolved in THF and precipitated in MTBE to obtain 51.1 g (76%).

TABLE 3

Reaction Time and Material Results for Synthetic Examples.

| Example | Reaction Time (h) | Yield (%) | Mw (RI) | Mn (RI) | PDI |
|---|---|---|---|---|---|
| 17 | 5.5 | 81 | 3376 | 2061 | 1.63 |
| 18 | 5.5 | 48 | 2643 | 1908 | 1.38 |
| 19 | 5.25 | 28 | 2840 | 2064 | 1.37 |
| 20 | 6 | 30 | 2620 | 2041 | 1.28 |

TABLE 3-continued

Reaction Time and Material Results for Synthetic Examples.

| Example | Reaction Time (h) | Yield (%) | Mw (RI) | Mn (RI) | PDI |
|---|---|---|---|---|---|
| 21 | 7 | 55 | 2495 | 1754 | 1.42 |
| 22 | 15 | Sol | 5205 | 1909 | 2.73 |
| 23 | 4 | Sol | 4065 | 1782 | 2.28 |
| 24 | 7 | 45 | 4355 | 2201 | 1.97 |
| 25 | 2 | 50 | 3562 | 2056 | 1.73 |
| 26 | 8 | 51 | 2849 | 1772 | 1.61 |

Examples 27-34

Crosslinker Materials

Example 27

Oligomer of Tetramethoxymethyl Glycoluril with Diol

To a 3 necked reactor equipped with an agitator, condenser, thermocouple and heating mantle was added 30 g of tetramethoxymethyl glycoluril, 60 g of tetrahydrofuran, and 21.3 g of ethylene glycol. The mixture was heated with stirring to 70° C. and 0.85 g of concentrated hydrochloric acid added. After three hours at 70° C. the reaction solution was cooled to 50° C. and 0.85 g of triethylamine added to neutralize the acid and to stabilize the product to further condensation reactions. The product mixture was cooled to ambient temperature, filtered to remove the hydrochloride salt and concentrated to dryness using a rotary evaporator. The product was found to have a molecular weight by gel permeation chromatography relative to polystyrene standards of about Mw=1430, Mn=1203 with about 9.7 area percent of tetramethoxymethyl glycoluril. Thermal gravimetric analysis of the sample shows minimal weight loss above 150° C. Under the same test conditions tetramethoxymethyl glycoluril has sublimed from the test equipment.

Example 28

To a 3 necked reactor equipped with an agitator, condenser, thermocouple and heating mantle was added 30 g of tetramethoxymethyl glycoluril and 60 g of methyl 2-hydroxyisobutyrate. The slurry was heated to 70° C. to achieve complete dissolution of the glycoluril. Concentrated hydrochloric acid (0.85 g) was added and the reaction solution held at 70° C. for three hours. Upon cooling to ambient temperature about 0.85 g of triethylamine was added and the mixture stirred for about 30 minutes. Upon standing a precipitate formed which was removed by filtration using a sintered glass filter. Molecular weight analysis of the solution by gel permeation chromatography relative to polystyrene standards gave about Mw=902, Mn=791 with about 37 area percent of unbounded tetramethoxymethyl glycoluril.

Example 29

Tetramethoxymethyl glycoluril (50 g) and methyl 2-hydroxyisobutyrate (100 g) were reacted according to the procedure of Example 28 except that 1.41 g of concentrated hydrochloric acid was used to drive the reaction and 1.41 g of triethylamine to stop it after 2.15 hours at 70° C. Molecular weight analysis of the solution by gel permeation chromatography relative to polystyrene standards gave about Mw=1696, Mn=853 with about 13.7 area percent of non reacted tetramethoxymethyl glycoluril.

Example 30

The process of Example 29 was repeated except that reaction was conducted at 90° C. for 4 hours using a 50 percent toluene sulfonic acid water mixture (0.544 g) as catalyst and about 0.145 g of triethylamine to neutralize the acid and to stop the reaction. Molecular weight analysis of the solution by gel permeation chromatography relative to polystyrene standards gave about Mw=974, Mn=645 with about 23.3 area percent of tetramethoxymethyl glycoluril.

Example 31

Tetramethoxymethyl glycoluril (10 g) was treated with 0.28 g of concentrated hydrochloric acid (source of water) in 20 g tetrahydrofuran according to the process of Example 28. About 0.28 g of triethylamine was added to neutralize the acid. Molecular weight analysis of the solution by gel permeation chromatography relative to polystyrene standards gave about Mw=616, Mn=529 with about 62 area percent of free tetramethoxymethyl glycoluril. Under more forceful conditions the reaction product precipitates from the reaction solution. This is not observed if a co-reactant such as an alcohol is also present in the reaction mixture.

Example 32

This example demonstrates attachment of the tetramethoxymethyl glycoluril to an anti-reflective resin. The reaction is promoted by trace acid present in the resin.

To a 3-necked reactor was added about 253.6 g of a resin solution containing about 18.8 wt. percent of resin from Example 24 in methyl 2-hydroxyisobutyrate and 12.25 g of tetramethoxymethyl glycoluril. The mixture was heated to 70° C. and kept at this temperature for 4.5 hours. The solution was then treated with a mixed bed ion exchange resin to remove the acid and filtered. Molecular weight analysis of the solution by gel permeation chromatography relative to polystyrene standards gave about Mw=3009, Mn=1470 with about 4.3 area percent of residual tetramethoxymethyl glycoluril. Thermal gravimetric analysis shows minimal weight loss at above about 140-150° C. Under the same test conditions tetramethoxymethyl glycoluril is observed to undergo substantial weight loss due to sublimation.

Example 33

The procedure of Example 32 was repeated except that the reaction was carried out at 90° C. for 1 hour. Molecular weight analysis of the solution by gel permeation chromatography relative to polystyrene standards gave about Mw=3881, Mn=1654 with about with about 3.2 percent (area percent) of free tetramethoxymethyl glycoluril.

Example 34

About 11.3 g of polymer of Example 2, about 2.82 g of tetramehoxymethyl glycoluril were dissolved in about 45.2 g of methyl 2-hydroxyisobutyrate. A catalytic amount of p-toluene sulfonic acid monohydrate (0.0048 g) was added and the reaction mixture heated at about 70° C. for about 1 hours. The reaction mixture was cooled to ambient temperature and analyzed by gel permeation chromatography using polystyrene standards. The resulting polymer was found to have a weight average molecular weight of about 67,010 Daltons with about 5 percent un-reacted tetramethoxymethyl glycoluril.

General Procedures for Formulation Examples 35-51

Representative polymer examples and modified glycolurils were formulated into anti-reflective compositions of the invention. Each composition was prepared by charging the indicated components into a clean bottle without regard to order of addition. The samples were shaken or placed on rollers until completely dissolved. Each sample was then passed through a 0.2 μm PTFE membrane filter into a clean bottle. Representative anti-reflective compositions of the invention were also characterized for optical density (OD), n and k optical parameters, oxide etch-rate, and solubility in propylene glycol methyl ether (PGME) or propylene glycol methyl ether acetate (PGMEA).

Example 35

Polymer of Example 24 was formulated into an anti-reflective composition by mixing together about 3.14 wt % polymer, about 0.80 wt % tetramethoxymethylglycoluril, about 0.06 wt % triethylammonium p-toluenesulfonate, and about 96 wt % methyl 2-hydroxyisobutyrate.

Example 36

Polymer of Example 24 was formulated into an anti-reflective composition by mixing together about 3.35 wt % polymer, about 0.61 wt % tetrabuthoxymethylglycoluril, about 0.061 wt % triethylammonium p-toluenesulfonate, and about 96 wt % methyl 2-hydroxyisobutyrate.

Example 37

Polymer of Example 24 was formulated into an anti-reflective composition by mixing together about 3.19 wt % polymer, about 0.57 wt % of product mixture from Example 28, about 0.04 wt % ammonium p-toluenesulfonate, and about 96.2 wt % methyl 2-hydroxyisobutyrate.

Example 38

Polymer of Example 24 was formulated into an anti-reflective composition by mixing together about 3.2 wt % polymer, about 0.76 wt % of product mixture from Example 27, about 0.04 wt % ammonium p-toluenesulfonate, and about 96 wt % methyl 2-hydroxyisobutyrate.

Example 39

Polymer of Example 24 was formulated into an anti-reflective composition by mixing together about 3.2 wt % polymer, about 0.76 wt % of product mixture from Example 31, about 0.04 wt % ammonium p-toluenesulfonate, and about 96 wt % methyl 2-hydroxyisobutyrate.

Example 40

Product mixture of Example 32 were formulated into an anti-reflective composition by mixing together about 3.96 wt % product mixture and about 0.04 wt % ammonium p-toluenesulfonate, and about 96 wt % methyl 2-hydroxyisobutyrate.

Example 41

Product mixture of Example 33 was formulated into an anti-reflective composition by mixing together about 3.96 wt % product mixture and about 0.04 wt % ammonium p-toluenesulfonate, and about 96 wt % methyl 2-hydroxyisobutyrate.

Examples 42-51

Examples 42 to 50 were prepared according to the procedure of Example 35 by mixing polymer of Example 19 with polymer of Example 4 and polymer of Example 19 with various HEMA:MMA copolymers prepared according to Example 5 to 12. Example 51 was prepared according to the procedure of Example 35 by blending polymer of Example 2 with polymer of Example 7. The polymers, polymer blend ratio, optical properties and oxide etch of the blends are summarized in Table 4.

The following procedure was employed to determine the optical density (OD) values, optical parameters (n, k) and etch rate as set forth in Table 4.

General Procedure for OD Determination

Optical density (OD) measurements were obtained by coating the formulated samples onto 4 inch silicon and quartz wafers using a table-top spin coater for 30 seconds. Spin-speeds varied as necessary to obtain film thickness in the range of 40-120 nm. The coated wafers were cured on a contact hotplate at 215° C. for 60 s. Film thickness (on silicon wafers) was measured by ellipsometry. The absorbance of the films on quartz was determined by UV spectrophotometry. The absorbance was measured against a blank quartz wafer. OD was calculated at 193 nm using thickness and absorbance measurements (Table 4).

General Procedure for Measuring Optical Parameters

Anti-reflectant coatings were obtained on 200 mm silicon wafers using an ACT8 coating tool. Spin-speeds varied as necessary to obtain film thickness in the range of 40-120 nm. Cure conditions were 215C/60 s on a proximity hotplate. Film thickness was determined by ellipsometry. A WVASE32 ellipsometer was used to determine the real (n) and imaginary (k) refractive indices (Table 4).

General Procedure for Measuring Etch-Rate

Anti-reflectant coatings for etch rate testing were obtained on 200 mm silicon wafers using an ACT8 coating tool. Spin-speeds varied as necessary to obtain film thickness greater than 100 nm. Cure conditions were 215C/60 s on a proximity hotplate. Film thickness was measured by ellipsometry. The films were then subject to blanket oxide etch ($C_4F_8/O_2/CO/Ar$) for 30 seconds. The thickness of the etched films was re-measured and an etch rate calculated (Table 4).

TABLE 4

193 nm Optical properties and oxide etch characteristics of anti-reflective examples.

| Example | Polymer from Example | % Polymer from Example in Blend | OD @ 193 nm | n @ 193 nm | k @ 193 nm | Oxide etch rate (A/sec) |
|---|---|---|---|---|---|---|
| 42 | 19 | 100 | 11.6 | 1.79 | 0.4 | 20.1 |
| 43 | 4 | 100 | | | 0.16 | |
| 44 | 4 | 75 | 6.3 | | 0.23 | 17 |
| 45 | 7 | 25 | 8.23 | 1.78 | 0.29 | |
| 46 | 8 | 25 | 9.2 | | 0.325 | |
| 47 | 8 | 50 | 6.31 | | 0.22 | 19 |

TABLE 4-continued 193 nm Optical properties and oxide etch characteristics of anti-reflective examples.

| Example | Polymer from Example | % Polymer from Example in Blend | OD @ 193 nm | n @ 193 nm | k @ 193 nm | Oxide etch rate (A/sec) |
|---|---|---|---|---|---|---|
| 48 | 8 | 75 | 3.72 | | 0.13 | |
| 49 | 10 | 75 | 3.64 | | 0.13 | 19 |
| 50 | 12 | 50 | 5.89 | | 0.21 | 18.6 |
| 51 | 7 | 38 | 7.95 | 1.73 | 0.28 | |

Examples 52 Through 54

Sublimation Comparison

The antireflective coatings of Examples 35, 39 and 40 were each spin coated onto one hundred (100) 200 mm silicon wafer set using an ACT8 wafer coating tool. Each wafer set was then tested according to the following Sublimation Detection Test:

Sublimation Detection Test—Procedure for TEL MARK 8

An aluminum foil "target" (depicted in FIG. 1) is used to determine the amount of material which sublimes from an anti-reflective coatings during the cross-linking bake step.

Procedure:
1. Using standard aluminum foil, make test targets as shown in the diagram in FIG. 1.
2. Using a 5 place Mettler balance, weigh Al template 3 times to determine measurement reproducibility.
3. Attach target to cover using 6 screws as depicted in FIG. 1.
4. Remove target and reweigh to establish initial target weight.
5. Carefully reattach target to cover and put cover back into proper operating position on TEL Mark 8.
6. Set up Tridak dispense unit via standard procedure, and fill with appropriate sample material.
7. Coat multiple wafers, typically 100, using standard dispense and bake recipes and flows.
8. Upon completion, cool hotplate and remove cover carefully so as not to disturb or tear the target.
9. Fold foil target for weighing, taking care not to dislodge material from target.
10. Reweigh target and record, calculating difference from initial target weight.
11. Repeat for next sample.

| | Anti-reflective Coating | Weight gain/ 100 wafers |
|---|---|---|
| Example 52 | 35 | 0.00109 |
| Example 53 | 39 | 0.00014 |
| Example 54 | 40 | 0.00027 |

Example 55

Lithographic Evaluation

The antireflective coatings of Examples 36-39 were spin coated on 200 mm silicon wafers using an ACT8 wafer coating tool, and then cured using a proximity hotplate at 215° C./60 s. Spin speeds were varied as necessary so that the antireflective film thickness after cure was 40-120 nm. Next, a chemically-amplified positive-acting photoresist containing a resin with photoacid-cleavable ester groups but no aromatic groups, a photoacid generator compound and a basic additive with solvent carrier was spin coated on top of the antireflective film, and dried at 120° C./90 seconds to give a 330 nm thick film of photoresist. The photoresist was then exposed through a target mask using a 193 nm ArF wafer scanner with a 0.75 numerical aperture and annular illumination with 0.85/0.55 inner/outer partial coherence. The exposed resist film was given a 120° C./60 sec post-exposure bake and then developed using an aqueous alkaline developer (2.38% tetramethyl ammonium hydroxide in water) in a standard 60 second single-puddle process.

The quality of the resist patterns was examined by scanning electron microscopy (SEM) at 75,000 magnification. The SEM images showed good pattern fidelity with a clean interface between the resist and the antireflective layer. The resist pattern was free of "standing wave" artifacts caused by reflective interference phenomena. SEM images of a 110 nm 1:1 line:space photoresist pattern over the antireflective coating of Examples 36 and 37 are shown in FIGS. 2 and 3 respectively.

The foregoing description of this invention is merely illustrative thereof, and it is understood that variations and modifications can be made without departing from the spirit or scope of the invention as set forth in the following claims.

What is claimed is:

1. A method of treating a microelectronic substrate, comprising:
    (a) applying an organic coating composition on the substrate, the coating composition comprising a resin component and a crosslinker component, wherein the crosslinker component has a molecular weight of at least about 3,000 daltons;
    (b) thermal treating the applied organic coating composition to cure the organic coating composition;
    (c) after the thermal treating, applying a photoresist composition layer above the antireflective composition layer, the photoresist coating layer comprising one or more resin with photoacid-labile groups and is substantially free of aromatic groups; and
    (d) exposing the photoresist coating layer to radiation having a wavelength of 193 nm.

2. The method of claim 1 wherein the crosslinker component comprises a reaction product of reagents comprising 1) one or more of glycoluril, melamine, urea, or guanamine compound, or mixtures thereof and 2) one or more compounds that comprise alcohol, carboxy and/or phenolic moieties.

3. The method of claim 1 wherein the antireflective coating composition comprises a polyester resin that comprises phenyl groups.

4. The method of claim 1 wherein the crosslinker component has a molecular weight of at least 4000 daltons.

5. A method of treating a microelectronic substrate, comprising:
    (a) applying an organic coating composition on the substrate, the coating composition comprising a resin component and a crosslinker component, wherein at least a portion of the crosslinker component is covalently linked to the resin with phenyl groups;
    (b) thermal treating the applied organic coating composition to cure the organic coating composition;
    (c) after the thermal treating, applying a photoresist composition layer above the antireflective composition layer, the photoresist coating layer comprising one or more resin with photoacid-labile groups and is substantially free of aromatic groups; and (d) exposing the photoresist coating layer to radiation having a wavelength of 193 nm.

6. The method of claim 1 wherein the crosslinker component has a molecular weight of at least 5000 daltons.

7. The method of claim 1 wherein the crosslinker component has a molecular weight of at least 6000 daltons.

8. The method of claim 5 wherein the crosslinker component has a molecular weight of at least 4000 daltons.

9. The method of claim 5 wherein the crosslinker component has a molecular weight of at least 5000 daltons.

10. The method of claim 5 wherein the crosslinker component has a molecular weight of at least 6000 daltons.

\* \* \* \* \*